United States Patent [19]

DeToia

[11] 4,242,147
[45] Dec. 30, 1980

[54] DEVICE FOR CONVERTING WASTE NUCLEAR ENERGY TO ELECTRICITY

[76] Inventor: Vincent D. DeToia, 3478 Kingsland Ave., Bronx, N.Y. 10469

[21] Appl. No.: 961,078

[22] Filed: Nov. 15, 1978

[51] Int. Cl.² ............................................. G21H 1/12
[52] U.S. Cl. .................................. 136/253; 136/202; 310/303
[58] Field of Search .................. 136/89 RT, 202; 310/303

[56] References Cited

U.S. PATENT DOCUMENTS 3,483,040   12/1969   Parkins .................................. 136/89

FOREIGN PATENT DOCUMENTS 1364784   5/1964   France ...................................... 136/89
638106   5/1950   United Kingdom ....................... 136/89

OTHER PUBLICATIONS

T. L. Brown, "General Chemistry", Charles E. Merrill Co. (1968), pp. 427–428.

*Primary Examiner*—Aaron Weisstuch
*Attorney, Agent, or Firm*—Howard I. Podell

[57] ABSTRACT

A device for converting waste nuclear energy to electricity comprising a shielded casing housing, a plurality of holders of radioactive materials surrounded by tubes of phosphorescent material to convert the radiation to electricity in adjacent photocells such as photoelectric or photovoltaic cells. The walls of the casing have mirrored top and bottom surfaces. Shade-type control means adjustably cover the photocells so as to regulate the amount of electricity produced.

7 Claims, 5 Drawing Figures

DEVICE FOR CONVERTING WASTE NUCLEAR ENERGY TO ELECTRICITY

FIELD OF THE INVENTION

This invention relates generally to a nuclear battery or device for converting waste nuclear energy to electricity.

DESCRIPTION OF THE PRIOR ART

The prior art, as exemplified by U.S. Pat. Nos. 3,999,057; 3,996,493; 3,564,234; 3,510,645; 3,833,828; 3,775,609; 3,497,392; 3,483,040; 3,351,516; 3,591,420; 3,751,303 and 3,857,036 is generally illustrative of the pertinent art but the aforementioned patents are non-applicable to the present invention. While the prior art expedients are generally acceptable for their intended purposes only, they have not proven entirely satisfactory in that they are either complex and expensive to manufacture, or bulky and inconvenient to use, or to operate. As a result of the shortcomings of the prior art, typified by the above, there has developed a substantial need for improvement in this field.

The principal object of this invention is to provide a device or article of readily merchandizable character which combines simplicity, strength and durability in a high degree, together with inexpensiveness of construction so as to encourage widespread use thereof.

Additional objects and advantages of the invention will be set forth in part in the description which follows and in part will be obvious from the description, or may be realized by practice of the invention, the objects and advantages being realized and attained by means of the instrumentalities and combinations particularly pointed out in the appended claims.

SUMMARY OF THE INVENTION

This invention resides in a device for converting waste nuclear energy to electricity comprising a shielded casing housing, a plurality of holders of radioactive materials surrounded by tubes of phosphorescent material to convert emitted phosphorescent radiation to electricity in adjacent photocells such as photoelectric or photovoltaic cells. The walls of the casing have mirrored top and bottom surfaces. Shade-type control means adjustably cover the photocells so as to regulate the amount of electricity produced.

BRIEF DESCRIPTION OF THE DRAWING

In the accompanying drawing, in which is shown one of the various possible illustrative embodiments of this invention, wherein like reference character identify the same or like parts.

DESCRIPTION OF THE PREFERRED EMBODIMENTS

Figure 2:
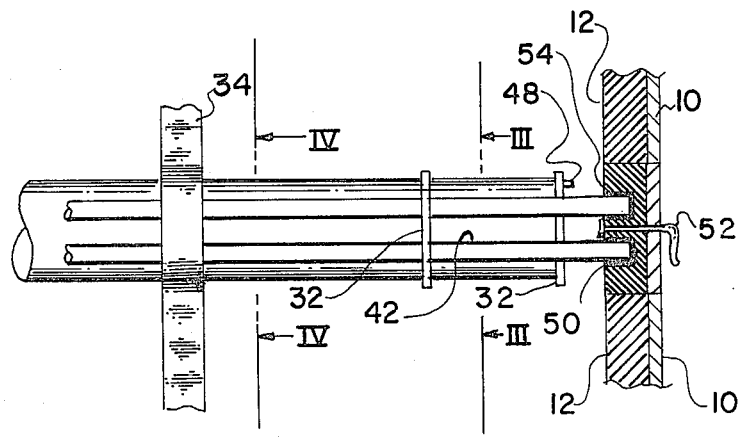
FIG. 2 is a detailed view showing arrangement of the tubes holding the radioactive material and the phosphorescent material.

Referring now to the drawing, there is shown and illustrated a device of the type above described and in accordance with the concept of this invention. The illustrated tangible embodiment of the invention includes a casing 10 made of steel with an inner shielding liner 12 of lead and with lid 14 hinged thereto by hinge 16 and closed by latch 18. Seals (not shown) are provided. Casing 10 is generally similar to an isotope storage unit.

A frame 20 is supported within casing 10 and includes a ceiling member 22 whose central interior-facing surface 23 is mirrored or silvered and a similar bottom member 24. A conduit 26 with exhaust valve 28 allows evacuation of the casing 10.

Figure 1:
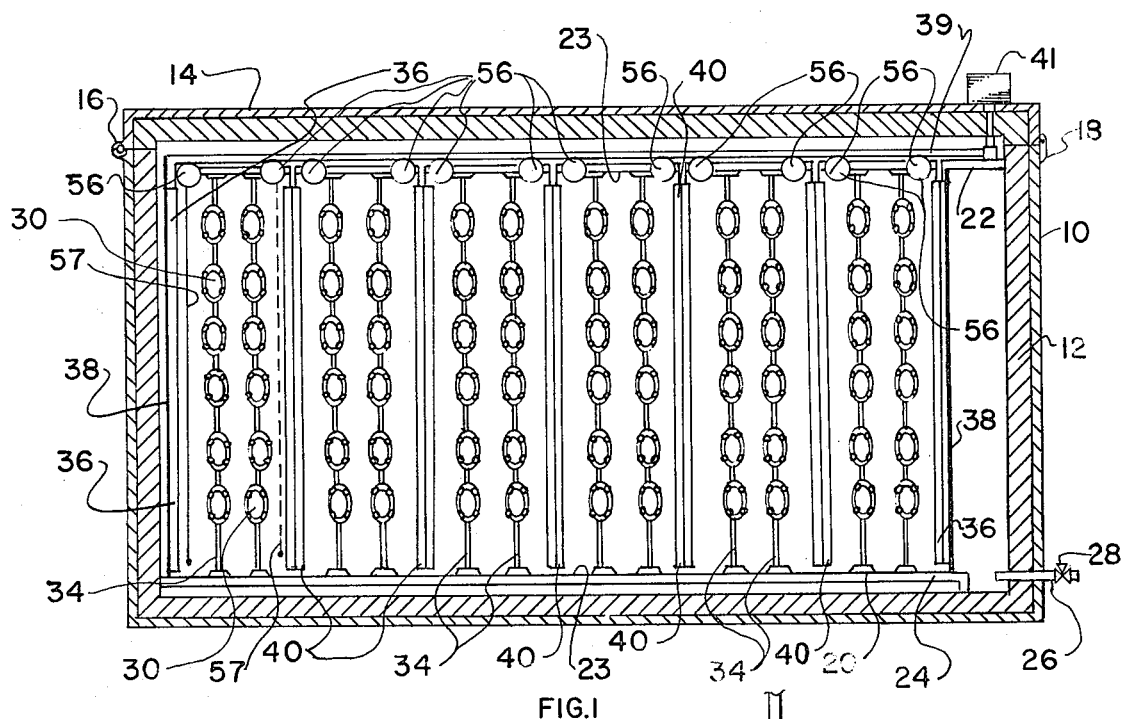
FIG. 1 is a sectional view through the unit of the invention.

As shown in FIGS. 1 and 2, a plurality of rows of elongated radiation resistant tubes 30 are in transparent plastic bindings 32 (such as of Lucite) some of which are secured to the top and bottom members of the frame 20 by supports 34. At each end of the frame are positioned single-sided photocells 36 mounted on side walls 38. Double-sided photocells 40 are mounted between each two vertical rows of transparent "Lucite" tubes 30. All the photocells 36 and 40 are electrically connected to collecting bus bar 39 and switch gear 41 so as to transmit electricity generated by the photocells to the switch gear 41.

Figures 3, 4, 5:
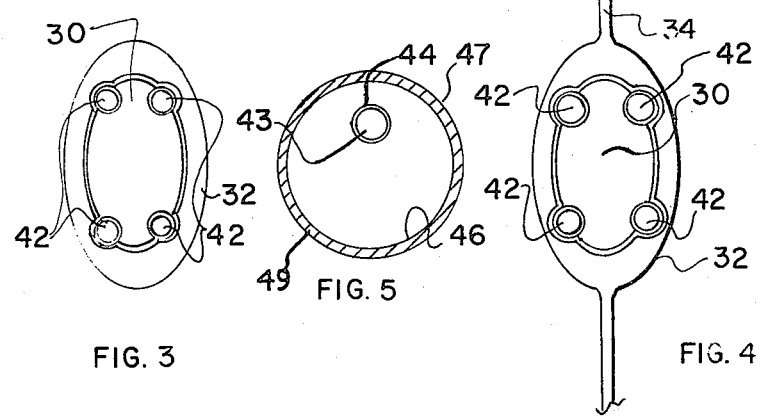
FIG. 3 is a cross-sectional view taken along line III—III of FIG. 2.
FIG. 4 is a cross-sectional view taken along line Iv—IV of FIG. 2.
FIG. 5 is a cross-sectional view taken through another embodiment of light producing means.

Four tubes 42 containing phosphorescent materials or a fluorescent gas are externally encapsulated to each tube 30 as shown in FIGS. 3, 4. The radioactive waste material in central tubes 30 such as waste heavy water or tritium excites the phosphorescent or fluorescent materials in tubes 42 and causes them to emit photons of light which impinge on the photocells 36 and 40. Preferably, these cells will be silicon solar type photocells because of their current lower costs.

Silicon solar type cells are made of two types of semiconductor silicon. One type has an added small number of boron atoms to provide a slight positive electronic charge. This is called "p" or positively doped silicon. The other, "n" type, negatively doped silicon, has added phosphorus or arsenic atoms. When these two types of silicon meet in a wafer, or solar electric cell, a "P-N" junction is formed with an electronic charge imbalance between the two layers.

Across this "P-N" junction, a basic polarity difference or voltage potential develops. The extra electrons from the phosphorus doped "n-type" silicon move to the boron atoms in the "p-type" silicon, where they fill an open place or "hole" in a boron electron band. This leaves the "n-type" silicon with a slight positive charge and the "p-type" with a slight negative charge.

When light shines on a cell junction, small packets of light called photons strike the atoms in the photocell, exciting electrons in the atoms to escape the strong pull of the protons in the nuclei. These liberated electrons move toward the positively charged "n-type" silicon and later out into the circuit wire to the pump, light, motor or other load which uses the electrical power. As with any electrical circuit, the loop must be completed back to the "p-type" silicon for the electrons to return to their starting place, with the circuit loop being completed by the external electrical load (not shown) connected to switch gear 41.

In this way, a portion of the energy in light is converted into the movement of electrons around a circuit.

Since light is made up of photons of various energies (corresponding to the various colors of the sunlight spectrum) and one photon can only excite and liberate one electron, the energy in a particular photon above that needed to liberate the electron is left over as heat. The electrical efficiency of a solar cell is the measure of electrical energy converted, as compared to the input energy that reached the cell. Current production methods yield silicon solar cells which exhibit efficiencies between 10% and 12% Laboratory methods have produced 16% to 18% efficient cells out of a maximum expected, or theoretical, limit of 22% to 23%.

All silicon solar type cells develop a voltage of about 0.45 volts per cell, regardless of size, with the maximum current varying according to manufacturing method and cell surface area. For a three inch diameter circular cell, current output ranges from 500 milliamperes to 1.2 amperes or more. This output is direct current similar to that from a battery. The current output from a cell will increase from zero in the dark to its maximum at about 100 milliwatts per square centimeter solar illumination. The voltage is dependent on cell temperature; it drops a small amount for each degree above a specified test temperature.

The individual photocells 36 mounted on sidewalls 38 and the individual photocells 40 are electrically joined to collecting bus bar 39 with groups of cells electrically connected together in series configuration so as to collectively produce a higher voltage than that of an individual cell and several such groups may be connected in parallel so as to produce a greater current flow than that of an individual group.

FIG. 5 shows a simplified alternative light-emitting unit. Here central tube 44 which contains the radioactive materials 43 is mounted inside of transparent tube 49 which has an internal coating 46 or an external coating 47 composed of fluorescent or phosphorescent chemicals such as phosphors which produce electroluminescence when subject to the radioactive radiation of the materials 43.

Inlets 48 are provided in the tubes 30 (FIG. 2) and 44 to replenish their contents. An external access door 50 with handle 52 mounted in a casing of the device gives access to tubes 42 which are externally closed at one end by caps 54.

Alternatively, the radioactive material in tubes 30 and 44 may be of a fluid or solid nature. If the radioactive material is of a fluid or powdered nature, it may be replaced through external piping (not shown) that is connected to tubes 30 and 44.

Preferably, in operation, the interior air space of the device is evacuated through conduit 26 to provide a low pressure atmosphere or vacuum in the interior of the device so as to provide minimum interference with the light emitted by the phosphorescent tubes striking the photocells.

Mechanically operated roll-up shade assemblies 56 are mounted in casing 10 and serve to shield the photocells 36 and 40 from the light emitted from transparent tubes 42 or from coating 46 when the shades 57 are extended to block the photocells as shown by dash lines in FIG. 1. This arrangement makes it possible to control the electrical output.

The operation and use of the invention hereinabove described will be evident to those skilled in the art to which it relates from a consideration of the foregoing.

The present invention is believed to accomplish among others all of the objects and advantages herein set forth.

Without further analyses, the foregoing will so fully reveal the gist of this invention that those skilled in the art can by applying current knowledge thereto readily adapt it for various applications without omitting certain features which can constitute essential characteristics of the generic or specific aspects of this invention. Therefore, a more lengthy description is deemed unnecessary.

It is intended that various changes may be made in this invention in the practical development thereof, if desired. Such changes are comprehended within the meaning and range of equivalency of the following claims. The invention, therefore, is not to be restricted except as is necessitated by the prior art.

Having thus described the invention, what is claimed as new and to be secured by Letters Patent is:

1. A device for converting radiation of nuclear waste material to electricity, comprising a shielded casing; a frame in said casing; a plurality of hollow first containers, each housing a volume of radioactive waste materials in fluid or powder form, with said first containers mounted on said frame, said first containers further comprising closeable inlet means for replenishing said waste materials in said first containers, light-emitting materials in at least one or more transparent second containers and at least partially surrounding each of said first containers and receiving radiation therefrom, thereby producing light; a plurality of photocells mounted on said frame in spaced relation thereto and receiving said light; current collecting means connected to said photocells for collecting electricity therefrom; and means for evacuating said casing, so as to provide a fluid-free interior space between said photocells and said light-emitting materials.

2. The invention as recited in claim 1, wherein said light emitting materials in said second containers are encapsulated with said first containers.

3. The invention as recited in claim 1, further including light reflective surfaces above and below said photocells.

4. The invention as in claim 1 wherein said radioactive materials consist of waste heavy water.

5. The invention as recited in claim 1 in which said second containers house said light emitting material in fluid form.

6. The invention as recited in claim 5 in which said second containers are fitted with closeable inlet means for replenishing the light-emitting material in said second containers.

7. A device for converting radiation to electricity comprising a shielded casing; a frame in said casing; a plurality of containers of radioactive materials mounted on said frame; light-emitting materials at least partially surrounding each of said containers and receiving radiation therefrom thereby producing light; a plurality of photocells mounted on said frame in spaced relation thereto and receiving said light; current collecting means connected to said photocells for collecting electricity therefrom; and means for evacuating said casing; further including mechanically operated shading means mounted between said light emitting materials and said photocells.

* * * * *